United States Patent [19]
Wolters et al.

[11] Patent Number: 5,278,450
[45] Date of Patent: Jan. 11, 1994

[54] SEMICONDUCTOR CONTACT WITH DISCONTINUOUS NOBLE METAL

[75] Inventors: Robertus A. M. Wolters; Edwin T. Swart; Andreas M. T. P. Van Der Putten, all of Eindhoven, Netherlands

[73] Assignee: U.S. Philips Corporation, New York, N.Y.

[21] Appl. No.: 818,004

[22] Filed: Jan. 8, 1992

[30] Foreign Application Priority Data

Jan. 11, 1991 [NL] Netherlands .................. 9100039

[51] Int. Cl.⁵ ............... H01L 23/48; H01L 29/46; H01L 29/54; H01L 29/62
[52] U.S. Cl. .................. 257/762; 257/750; 257/768; 257/769
[58] Field of Search .............. 357/71; 437/230; 257/741, 748, 752, 758, 762, 767, 768, 769, 765

[56] References Cited

U.S. PATENT DOCUMENTS

| | | | |
|---|---|---|---|
| 4,151,545 | 4/1979 | Schnepf et al. | 357/71 |
| 4,431,685 | 2/1984 | Canestaro et al. | 437/230 |
| 4,520,554 | 6/1985 | Fisher | 357/71 R |
| 4,931,845 | 6/1990 | Ema | 357/71 |
| 5,017,516 | 5/1991 | Van Der Putten | 437/230 |
| 5,158,860 | 10/1992 | Gulla et al. | 427/304 |

Primary Examiner—William D. Larkins
Assistant Examiner—Alice Wu
Attorney, Agent, or Firm—Steven R. Biren

[57] ABSTRACT

A semiconductor device with a monocrystalline silicon body (1) is provided with a dielectric layer (2) with contact holes (3) through which the silicon body (1) is contacted with an aluminum metallization. To avoid undesirable separation of silicon, a discontinuous nucleus layer (5) of a metal nobler than silicon is formed on the silicon body (1) in the contact holes (3) preceding the provision of the metallization (4). Metals such as palladium and copper may be used to form the discontinuous layer.

2 Claims, 1 Drawing Sheet

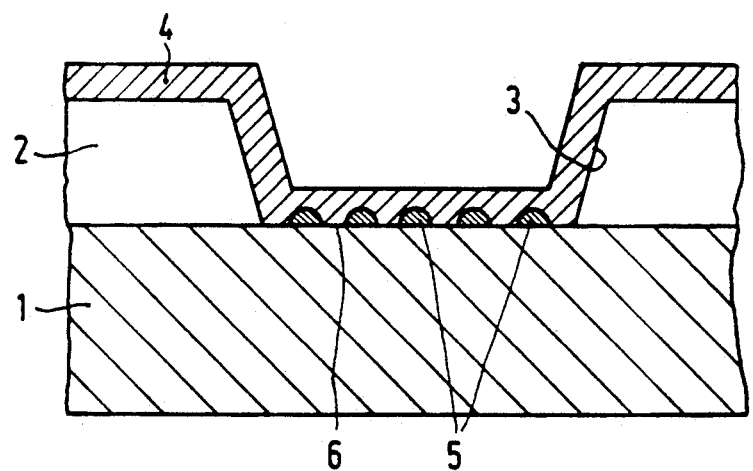

SEMICONDUCTOR CONTACT WITH DISCONTINUOUS NOBLE METAL

BACKGROUND OF THE INVENTION

The invention relates to a semiconductor device comprising a monocrystalline silicon body which is provided at one side with a dielectric layer in which contact holes are present through which the silicon body is contacted with a metallization comprising aluminum and silicon.

A semiconductor device of the kind mentioned above has long been known in semiconductor technology, but is not always free from problems.

Thus, for example, the resistance between the metallization and the silicon body may be high, often too high, especially when the contact holes have a small width, for example 1 to 2 $\mu m$.

Such a high resistance arises from the fact that, during the provision of the metallization comprising aluminum and silicon, silicon separates out the metallization at the surface of the silicon body in the contact holes. The metallization then eventually is in contact with a surface region of practically undoped silicon, which obviously has a high contact resistance.

It has been suggested to render a surface portion of the silicon region amorphous, for example in the Japanese Patent Application 63-29503, so that, separation in the form of crystallization of the silicon present in the aluminum is limited.

This measure, however, is not sufficient for counteracting the problem described, because amorphous silicon of the silicon body is easily dissolved in the aluminum during the provision of the metallization and is epitaxially deposited therefrom, so that the problem of the high contact resistance remains.

SUMMARY OF THE INVENTION

The invention has for its object inter alia to counteract the said problem and is based on the insight that this, is possible when separation effects at the interface of the metallization comprising aluminum and silicon and the monocrystalline silicon can be avoided, while a good contact between the metallization and the silicon is maintained.

According to the invention, therefore, a semiconductor device as described above is characterized in that a discontinuous nucleus layer of a metal nobler (i.e. less reactive; having a greater resistance to corrosion or oxidation) than silicon is present in the contact holes between the silicon body and the metallization comprising aluminum and silicon.

The discontinuous layer renders, it possible to maintain the contact between the metallization comprising aluminum and silicon and the silicon body, while undesirable separation effects do not occur.

Preferably, the discontinuous nucleus layer consists of palladium or copper. It will become apparent below that palladium or copper layers can be formed in a simple and inexpensive manner without extra steps during manufacture.

The invention, accordingly, also relates to a method of manufacturing a semiconductor device whereby on a monocrystalline silicon body a dielectric layer is formed which is provided with contact holes, and the silicon body is subjected to a treatment at the area of the contact holes to avoid preferential separation of silicon during the formation of a metallization comprising aluminum and silicon in the contact holes on the silicon body which follows the treatment.

It will be clear from the above that a treatment by which the silicon body is converted into amorphous silicon at its surface in the contact holes does not effectively counteract the separation problem.

According to the invention, therefore, the above method is characterized in that during the treatment a discontinuous nucleus layer is formed on the surface of the silicon body in the contact holes by local exchange of silicon against a metal nobler than silicon. In the method according to the invention, the discontinuous layer is formed on the silicon in the contact holes only.

The treatment is particularly simple and inexpensive if it is carried out in an aqueous environment.

An extra treatment step is not even necessary for the treatment if the nobler metal is added to a usual etching bath containing hydrogen fluoride in which the silicon body is immersed preceding the formation of the metallization.

Preferably, the nobler metal is added to the bath in the form of a palladium salt or a copper salt.

The nuclei have a size of a few nm and the percentage of covering of the silicon surface by the nuclei is approximately 5 to 10% in the contact hole.

BRIEF DESCRIPTION OF THE DRAWING

The invention will now be explained with reference to an embodiment and the accompanying drawing.

The drawing diagrammatically and in cross-section shows a portion of a semiconductor device in a stage of manufacture by means of the method according to the invention.

DESCRIPTION OF THE PREFERRED EMBODIMENTS

The FIGURE shows the monocrystalline silicon body 1, the dielectric layer 2, a contact hole 3, and the metallization 4 comprising aluminum and silicon and contacting the silicon body 1 of the semiconductor device.

To prevent preferential separation of silicon on the silicon adjoining the metallization 4, there is according to the invention a discontinuous nucleus layer 5 of a metal nobler than silicon in the contact hole 3 between the silicon body 1 and the metallization 4 comprising aluminum and silicon.

This metal may be, for example, palladium or copper.

The nucleus layer 5 is obtained in a simple manner by a treatment of the surface 6 of the silicon body 1 in the contact hole 3, whereby silicon is locally exchanged against a metal nobler than silicon.

Such an exchange takes place, for example, in an aqueous environment, for example by the addition of the nobler metal to a bath containing hydrogen fluoride in which the silicon body 1 is immersed preceding the formation of the metallization 4.

The nobler metal is present in the bath in the form of, for example, a palladium salt or a copper salt.

EXAMPLE

The method starts, for example, with a p-type silicon body 1 on which a 0.6 $\mu m$ thick silicon dioxide layer 2 is formed in usual manner, in which then a 1.4 $\mu m$ wide contact hole 3 is provided.

In usual manner, the silicon body is then cleaned in a dip etching bath containing 1% hydrogen fluoride at room temperature for one minute.

According to the invention, 5 mg palladium (II) chloride per liter is added to this bath, so that during the dip etching treatment the discontinuous nucleus layer 5 with nuclei having a size of 5-10 nm is formed over approximately 5% of the silicon surface area.

After this, a metallization 4 of aluminum with 1% silicon may be provided in usual manner without undesirable separation taking place.

A semiconductor device, as required, may be manufactured from the structure thus obtained, also in usual manner.

Obviously, the invention is not limited to the example given. Instead of the palladium (II) chloride, for example, copper (II) chloride or copper (II) sulphate may be added to the hydrogen fluoride solution.

It will be apparent from the above that both the semiconductor device and the method of manufacturing it may be varied in many ways within the scope of the invention.

We claim:

1. A semiconductor device comprising a monocrystalline silicon body which is provided at one side with a dielectric layer in which contact holes are present through which the silicon body is contact with a metallization comprising aluminum and silicon, characterized in that a discontinuous nucleus layer of a metal nobler than silicon is present in the contact holes between the silicon body and the metallization comprising aluminum and silicon.

2. A semiconductor device as claimed in claim 1, characterized in that the discontinuous nucleus layer is formed of a metal selected from the group consisting of palladium and copper.

* * * * *